(12) United States Patent
Hosokawa

(10) Patent No.: US 8,532,415 B2
(45) Date of Patent: Sep. 10, 2013

(54) DATA COMPRESSION METHOD

(75) Inventor: Satoshi Hosokawa, Tokyo (JP)

(73) Assignee: NEC Corporation, Tokyo (JP)

( * ) Notice: Subject to any disclaimer, the term of this patent is extended or adjusted under 35 U.S.C. 154(b) by 712 days.

(21) Appl. No.: 12/739,779

(22) PCT Filed: Oct. 16, 2008

(86) PCT No.: PCT/JP2008/068787
§ 371 (c)(1),
(2), (4) Date: Apr. 26, 2010

(87) PCT Pub. No.: WO2009/057459
PCT Pub. Date: May 7, 2009

(65) Prior Publication Data
US 2010/0246983 A1 Sep. 30, 2010

(30) Foreign Application Priority Data
Oct. 30, 2007 (JP) ................. 2007-281090

(51) Int. Cl.
*G06T 9/00* (2006.01)
(52) U.S. Cl.
USPC ........................................................ 382/244
(58) Field of Classification Search
None
See application file for complete search history.

(56) References Cited

U.S. PATENT DOCUMENTS

| 5,729,228 A | * | 3/1998 | Franaszek et al. | 341/106 |
| 5,956,504 A | * | 9/1999 | Jagadish et al. | 1/1 |
| 6,721,455 B1 | * | 4/2004 | Gourdol | 382/232 |

FOREIGN PATENT DOCUMENTS

| JP | 5-252047 A | 9/1993 |
| JP | 6-168096 A | 6/1994 |
| JP | 7-184063 A | 7/1995 |
| JP | 8-314689 A | 11/1996 |
| JP | 9-69784 A | 3/1997 |
| JP | 2000195896 A | 7/2000 |
| JP | 2000315954 A | 11/2000 |
| JP | 2006100973 A | 4/2006 |

OTHER PUBLICATIONS

International Search Report for PCT/JP2008/068787 mailed Nov. 11, 2008.

* cited by examiner

*Primary Examiner* — Brian P Werner

(57) ABSTRACT

A data stream of a code string is divided into a series of a group of blocks. The first block of the group of blocks is compressed by a sliding dictionary method with codes of the first block as a reference dictionary. Blocks subsequent to the first block are recognized in succession as a target block to be compressed. Each time the target block is recognized, the target block is compressed by the sliding dictionary method with codes of the target block and results of compression of a group of blocks prior to the target block as a reference dictionary, and a result of compression of the target block is arranged at an end of the results of compression of the group of prior blocks.

9 Claims, 9 Drawing Sheets

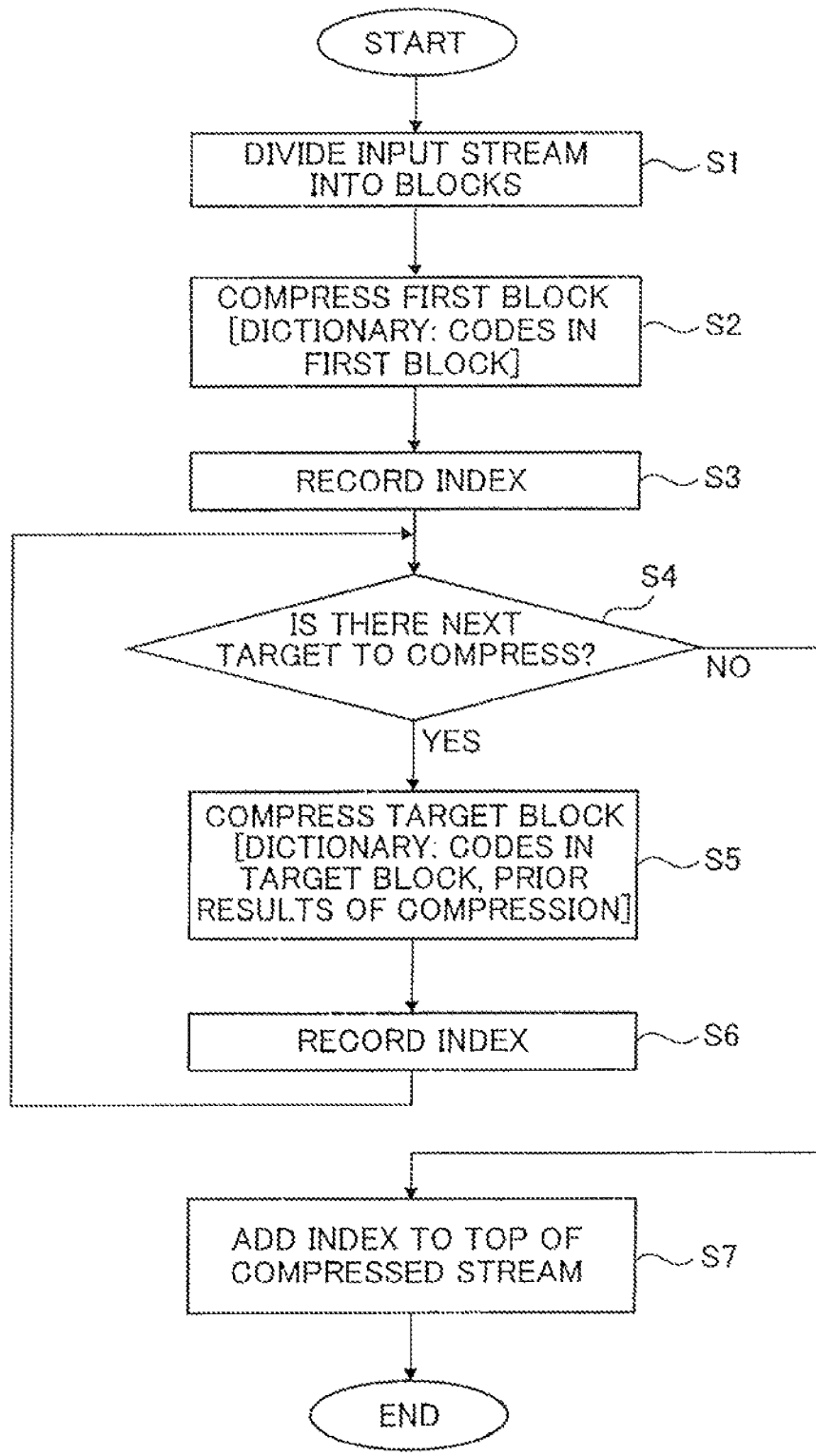

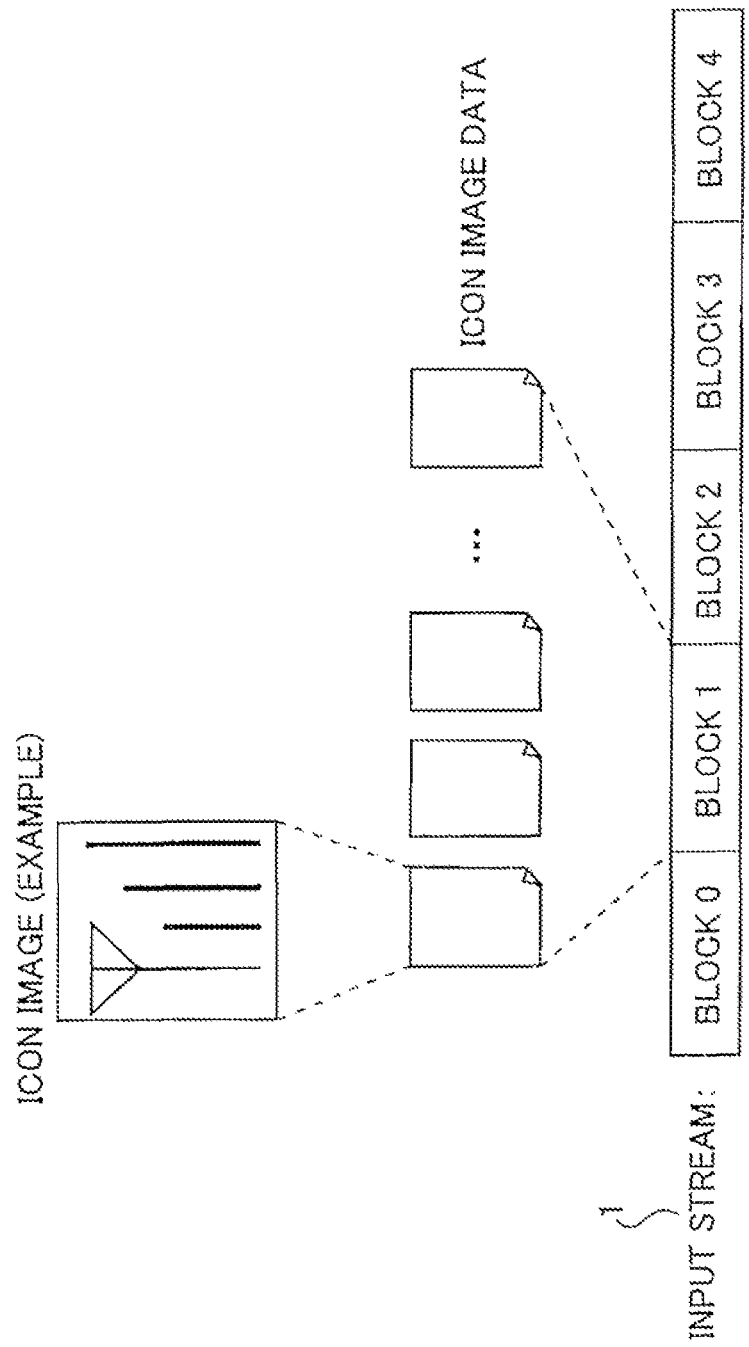

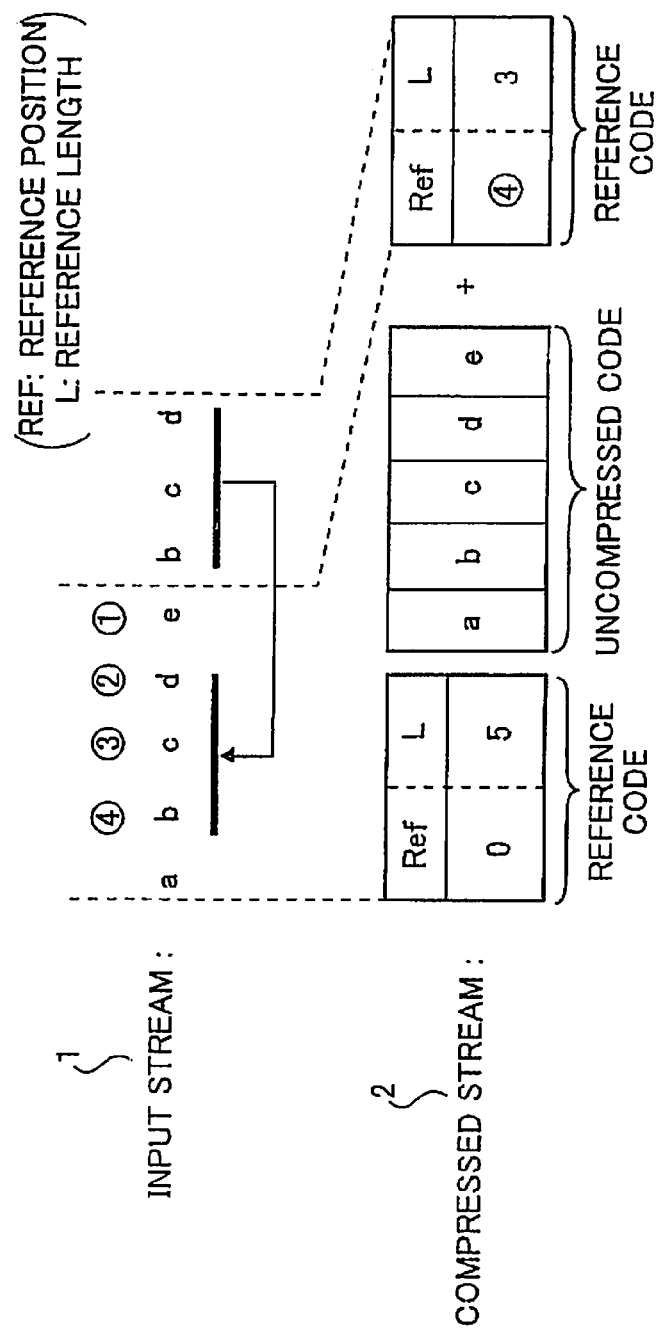

DATA COMPRESSION METHOD

This application is the National Phase of PCT/JP2008/068787, filed Oct. 16, 2008, which is based upon and claims the benefit of priority from prior Japanese Patent Application No. 2007-281090, filed Oct. 30, 2007, the entire contents of which are incorporated herein by reference.

TECHNICAL FIELD

The present invention relates to processing for data compression.

BACKGROUND ART

As one of techniques for data compression, there is what is called a sliding dictionary method (LZ77: Lempel-Ziv coding 1977). In the encoding (data compression) based on the sliding dictionary method, a buffer of predetermined length is regarded as a window. A data stream is input and output to/from the buffer in a FIFO (First-In First-Out) manner to slide the window frame. A longest-matching code string pattern is detected within the window frame, and the position information and the number of codes on the matching code string are encoded for data compression.

FIG. 4 shows an example of the data compression based on the sliding dictionary method. Suppose that a data stream "abcdebcd" is input. The code string from the top of the input stream to "abcde" is composed of different codes. The subsequent "bcd," on the other hand, is composed of the same codes as ones included in the prior code string "abcde."

When the foregoing input stream is compressed by the sliding dictionary method, as shown in FIG. 4, a reference code consisting of reference position (Ref) "0" and reference length (L) "5" is output for the leading code "abcde," followed by the original non-reference code "abcde." The reference position indicates the position of the dictionary (code) to be referred to. The leading "abcde" in this example consists of respectively different codes, and includes no candidate to be referred to. The reference position is thus set to "0."

When the subsequent code string "bcd" is compressed, the previously processed "abcde" is used as a dictionary. The dictionary "abcde" contains a candidate "bcd" to be referred to for the subsequent code string "bcd." Here, as shown in FIG. 4, a reference code consisting of reference position "4," which is the value of return (offset value) from the end of the dictionary to the reference start position, and reference length "3," which is the number of codes of the reference candidate, is output instead of the original code string "bcd."

FIG. 5 shows another example of the data compression based on the sliding dictionary method. In this example, the input stream is "abcdedededed." For the code string from the top to "abcde," a reference code consisting of reference position "0" and reference length "5," followed by the original code string "abcde," is output as in the foregoing example (FIG. 4).

For the subsequent code string "dededed," the reference position is determined to be "2" since the first "de" is included in the code string "abcde" as the dictionary. For the remaining "deded," a setting is made such that the second "de" and the third "d" are referred to in succession after the first "de" is referred to, as shown in FIG. 5. For such a setting, the reference length is determined to be "7" which is the total number of "dededed." As a result, a reference code consisting of reference position "2" and reference length "7" is output instead of the original code string "dededed."

If a reference code is such that [reference position] is smaller than [reference length] ([reference position]<[reference length]) as in the example of FIG. 5, the reference code is decoded by repeating the processing of creating a result of decoding by referring to a previously-decoded code string, and then creating a new result of decoding by referring to the result of decoding. That is, the decoding is performed by a procedure reverse to the shown compression procedure. The codes are thus restored as much as the reference length set at compression time.

As described above, according to the sliding dictionary method, codes that occur a plurality of times in the input stream are converted into a reference code consisting of a reference position and a reference length upon the second and subsequent occurrences. The stream can thus be reduced in data volume.

To decode a compressed stream, on the other hand, entire preceding data need to have been decoded in advance even if the decoding of the stream is from a midpoint. Such a restriction produces the problem that the decoding takes a long time in applications where large data is decoded only in part.

An example of the techniques for avoiding such a situation is the compression method described in PTL 1. The compression method in the literature includes dividing an input stream into blocks of appropriate size, and performing data compression by the sliding dictionary method in each block.

CITATION LIST

Patent Literature

{PTL 1} JP-A-6-168096 (pp. 8-10)

SUMMARY OF INVENTION

Technical Problem

According to the compression method of the foregoing literature, the dictionary based on the sliding dictionary method is initialized in each block, and the maximum size of the dictionary is thus limited by the block length. Consequently, with the technique of the foregoing literature, the compression rate of the input stream may drop due to the limited dictionary size.

It is an object of the present invention to provide a technology for suppressing a drop in the compression rate of the processing for compressing an input stream that is divided in blocks.

Solution to Problem

A data compression method according to the present invention includes: dividing a data stream of a code string into a series of blocks; compressing a first block of the blocks by a sliding dictionary method with codes of the first block as a reference dictionary; recognizing blocks subsequent to the first block in succession as a target block to be compressed; and compressing the target block by the sliding dictionary method with codes of the target block and results of compression of blocks prior to the target block as a reference dictionary each time the target block is recognized, and arranging a result of compression of the target block at an end of the results of compression of the prior blocks.

A data compression apparatus according to the present invention includes: a means for dividing a data stream of a code string into a series of blocks; a means for compressing a first block of the blocks by a sliding dictionary method with codes of the first block as a reference dictionary; a means for recognizing blocks subsequent to the first block in succession as a target block to be compressed; and a means for compressing, each time the target block is recognized, the target block by the sliding dictionary method with codes of the target block and results of compression of blocks prior to the target block as a reference dictionary, and arranging a result of compression of the target block at an end of the results of compression of the prior blocks.

Advantageous Effects of Invention

According to the present invention, it is possible to suppress a drop in the compression rate of the processing for compressing an input stream that is divided in blocks.

BRIEF DESCRIPTION OF DRAWINGS

FIG. 1A is an explanatory diagram of an input stream and a compressed stream according to an embodiment of the present invention.

{FIG. 1B} FIG. 1B is a flowchart showing the operation procedure of the embodiment of the present invention.

FIG. 2A is an explanatory diagram of compression processing according to the embodiment of the present invention.

FIG. 2B is an explanatory diagram of the compression processing according to the embodiment of the present invention.

FIG. 2C is an explanatory diagram of the compression processing according to the embodiment of the present invention.

FIG. 2D is an explanatory diagram of the compression processing according to the related art.

{FIG. 3} FIG. 3 is an explanatory diagram of an input stream according to another embodiment of the present invention.

{FIG. 4} FIG. 4 is an explanatory diagram of compression processing based on a sliding dictionary method.

FIG. 5 is an explanatory diagram of the compression processing based on the sliding dictionary method.

REFERENCE SIGNS LIST

1: input stream
2: compressed stream
2a: index

DESCRIPTION OF EMBODIMENTS

Figure 1A:
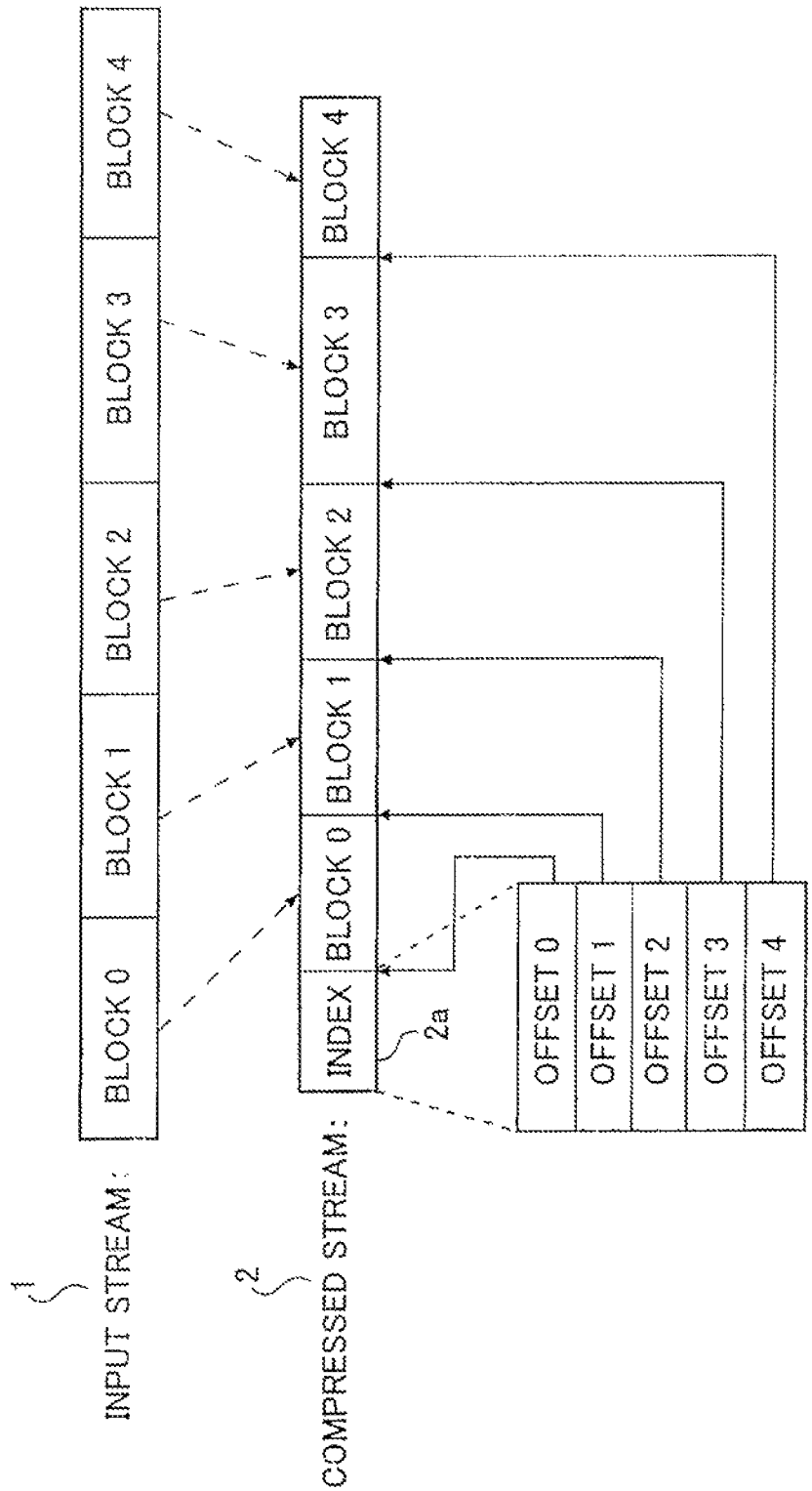
{FIG. 1A}

An embodiment of the present invention will be described in detail with reference to the drawings. FIG. 1A shows the concept of an input stream 1 and a compressed stream 2 according to the present embodiment. The input stream 1 is divided into blocks of predetermined length before compression processing. In the shown example, the input stream 1 is divided into five blocks "block 0" to "block 4."

The compressed stream 2 is a series of results of compression obtained by compression processing, to be described later, on the respective blocks of the input stream 1. An index 2a that describes information on the start positions of the respective blocks in the compressed stream 2 ("offset 0" to "offset 4") is added to the top of the compressed stream 2.

The operation of the present embodiment will be described with reference to a flowchart shown in FIG. 1B. The following operation is intended to be performed by a computer (not shown) that serves as a data compression apparatus according to the present invention.

The computer divides the input stream 1 into predetermined units of blocks such as 16 KB (step S1). The computer applies the following compression processing based on the sliding dictionary method to the group of blocks.

In the compression processing, the computer initially recognizes the first block of the group of blocks, and compresses the code string by using the codes of the first block as a dictionary (step S2).

Figure 2A:
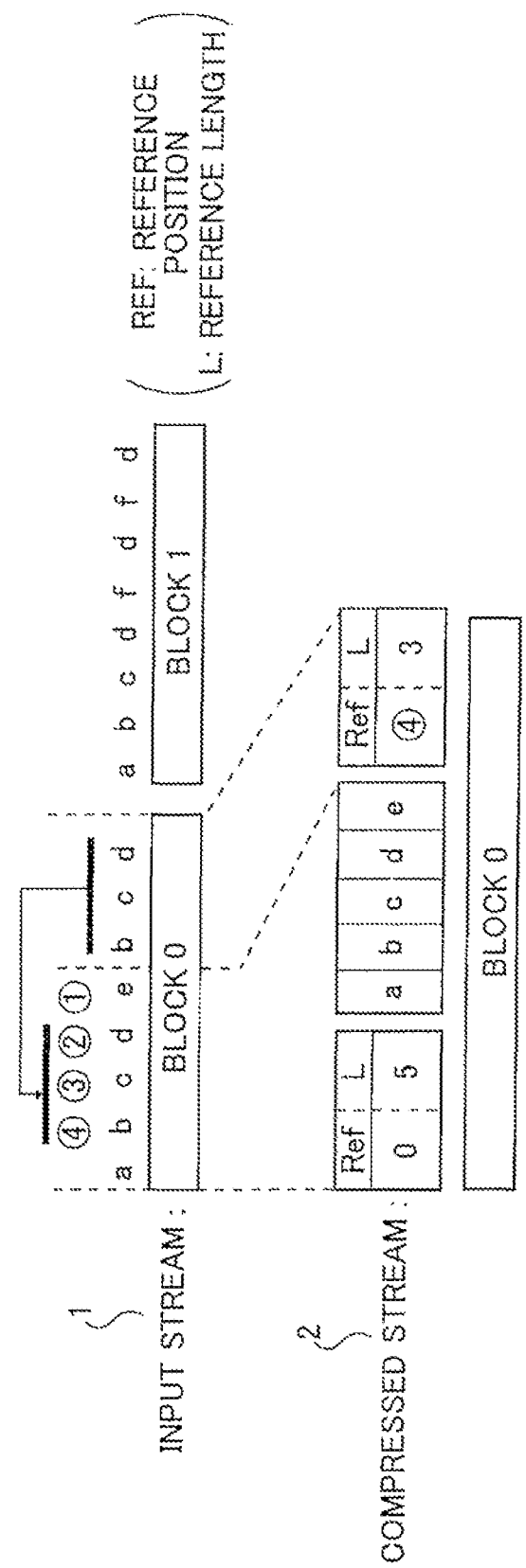
{FIG. 2A}

Referring to FIG. 2A, the compression of the first block will be described by using a concrete example. This example assumes that a total of 16 codes "abcdebcdabcdfdfd" are currently being obtained as the input stream 1. Further, this example assumes that the predetermined block length is as much as eight codes of data. The current input stream 1 is thus divided in two blocks, the first block "block 0" consisting of "abcdebcd" and the subsequent block "block 1" consisting of "abcdfdfd."

The computer recognizes "abcdebcd" of the first "block 0," and determines that there is no dictionary to be referred to as for the code string up to "abcde" from the top. According to the sliding dictionary method, the computer outputs reference position "0" and reference length "5," followed by the original code string "abcde," as the result of compression. As for the remaining code string "bcd" of the "block 0," there is a dictionary in the previously processed "abcde." Based on the sliding dictionary method, reference position "4" and reference length "3" are thus output as the result of compression of the code string "bcd."

Completing the compression of the first block by the foregoing procedure, the computer records the information on the start position of the result of compression as an index (FIG. 1B: step S3). In the example of FIG. 2A, the position of reference code "0, 5" of the "block 0" in the compressed stream 2 is recorded as the index. Such position information on the "block 0" corresponds to the "offset 0" in FIG. 1A. Note that the reference code is handled as a single code by a combination of a reference position and a reference length.

The computer checks whether there is a next target block to be compressed. If there is any target block (step S4: Yes), the computer performs the compression processing on the target block (step S5). In the compression processing, the computer uses the code string of the target block and the results of compression of the blocks prior to the target block as a dictionary. Each time the compression processing is performed, the start position of the result of compression is recorded as an index (step S6).

Figure 2B:
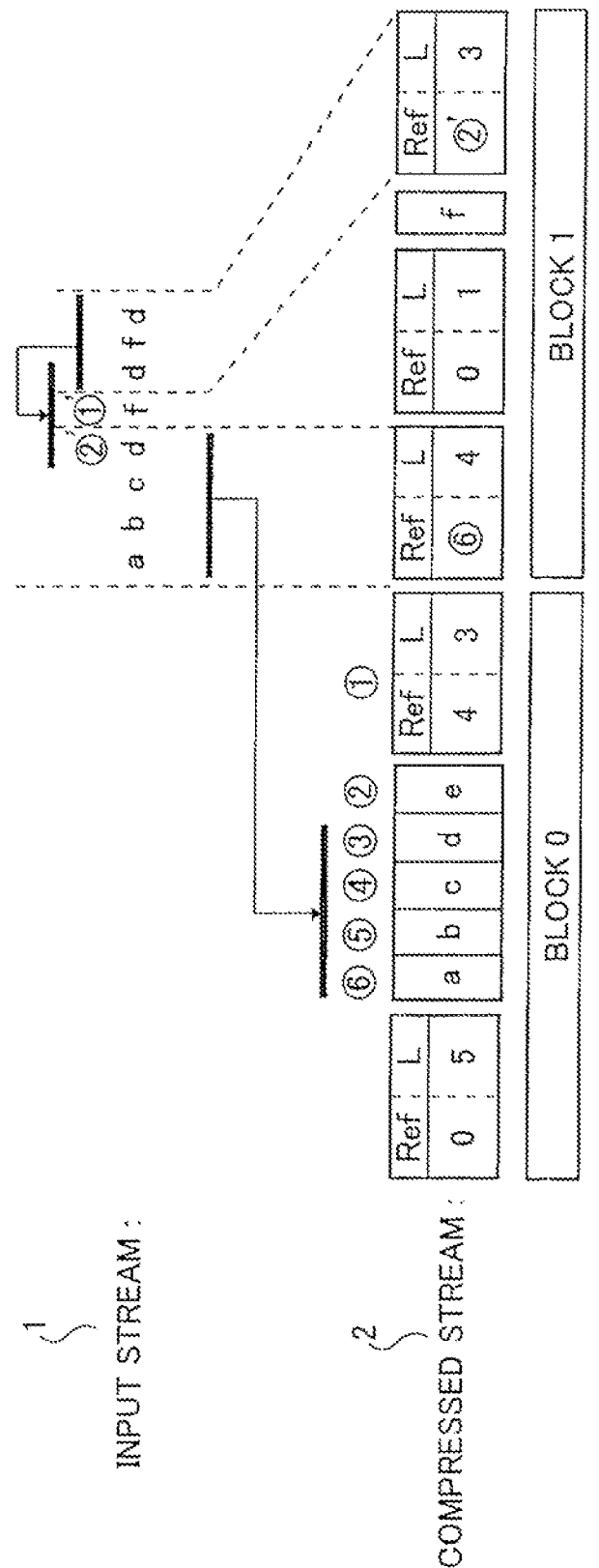
{FIG. 2B}

Referring to FIG. 2B, the compression of the block subsequent to the first block will be described by using a concrete example. This example assumes that the foregoing compression processing on the first "block 0" (FIG. 2A) has been completed. When compressing the next "block 1," the computer uses not only the code string in the block but also the result of compression of the prior "block 0" as a dictionary.

The computer recognizes the code string "abcdfdfd" of the "block 1," and determines that up to "abcd" from the top is included in the result of compression of the prior "block 0." As the result of compression of "abcd," the computer then determines that the reference position is "6," which is the offset value from the end position of the "block 0," and the reference length is "3," which is the number of codes to be referred to. The result of compression is arranged to follow the end of the result of compression of the "block 0."

In the "block 1," the "f" that follows the foregoing "abcd" is not included in the previously processed "abcd" and the result of compression of the "block 0." The computer thus outputs reference position "0," reference length "1," and the code "f" as the result of compression of "f."

Figure 5:
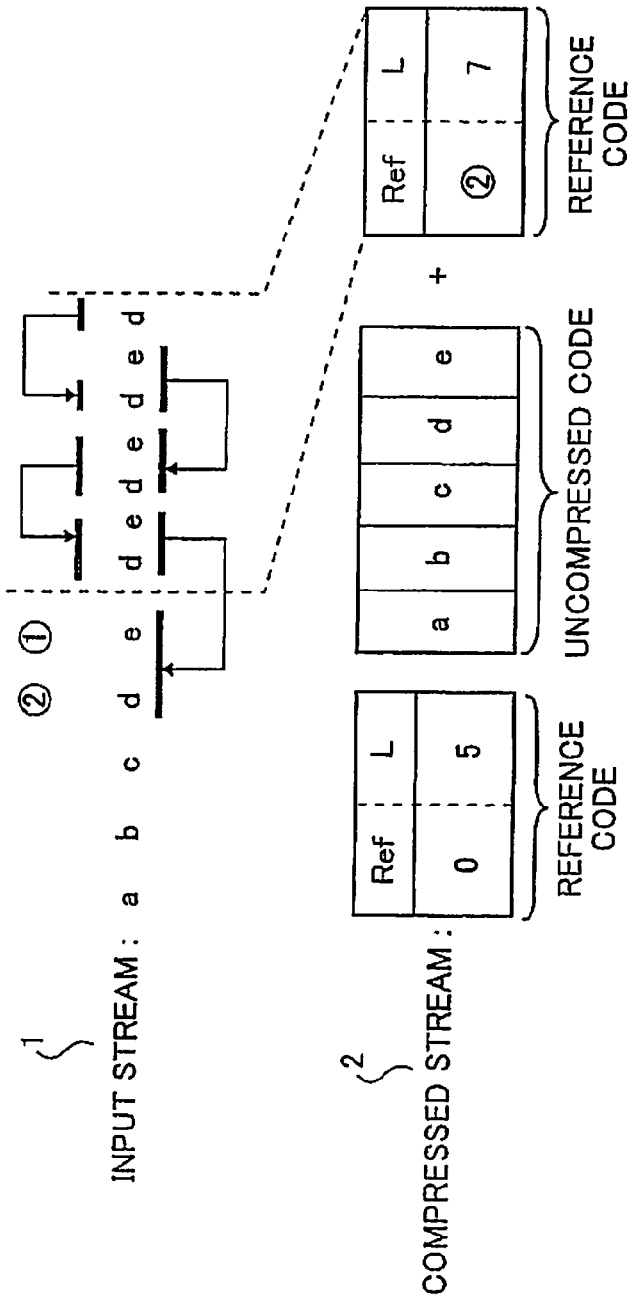
{FIG. 5}

Of the succeeding "dfd" in the "block 1," "df" is included in the previously processed "abcdf." The computer thus outputs reference position "2" and reference length "3" as the result of compression of "dfd." Such a compression procedure conforms to the procedure of FIG. 5 seen above, namely, applies to the case where the reference code satisfies [reference position]<[reference length].

Figure 2C:
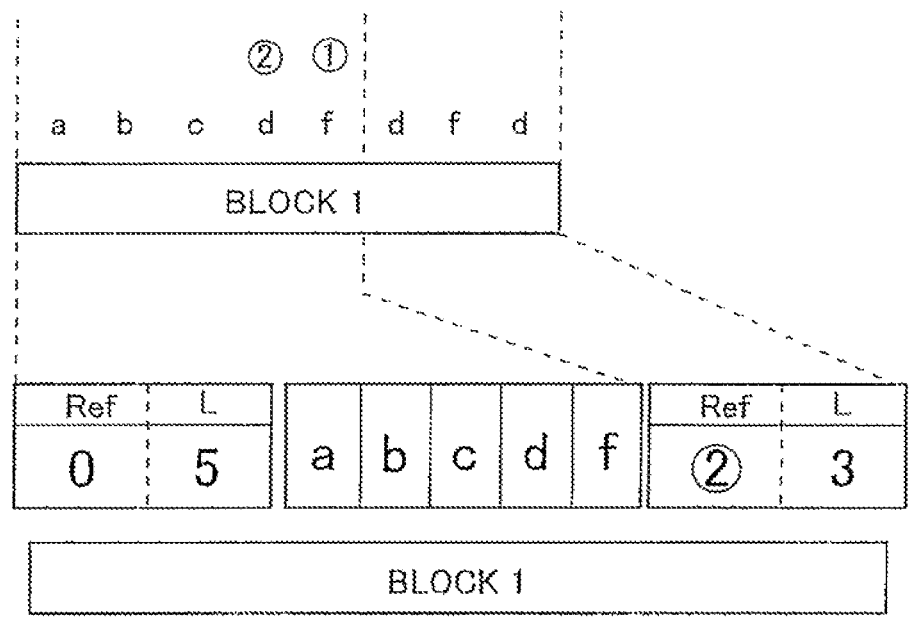
{FIG. 2C}

Suppose now that the "block 1" described above is compressed by a technique where the dictionary is initialized in each block, like the technique of the foregoing PTL 1. The result of compression will be as shown in FIG. 2C. With such a technique, the result of compression of the prior "block 0" is not included in the dictionary to be referred to when compressing the "block 1." The result of compression of the "block 1" is composed of seven codes including two reference codes "0, 5" and "2, 3" and five codes "abcdf." In contrast, according to the compression processing to which the present invention is applied (FIG. 2B), the result of compression of the "block 1" is composed of four codes including three reference codes "6, 4," "0, 1," and "2, 3," and a single code "f." It can thus be seen that the application of the compression method of the present invention allows a reduction of three codes.

Figure 2D:
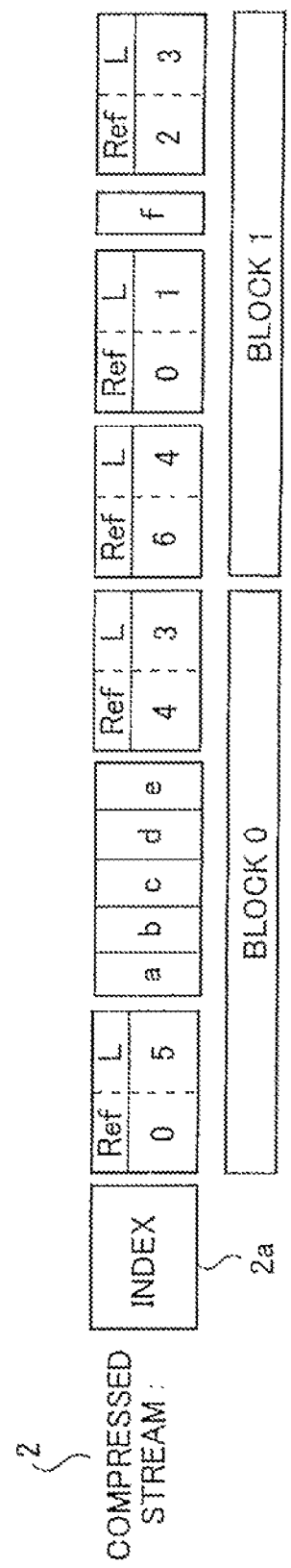
{FIG. 2D}

By the procedure described above, the computer proceeds with the compressing processing on the blocks subsequent to the initial block. When the compression of all the blocks in the input stream 1 is completed (in FIG. 1B, step S4: No), the computer adds an index 2a that describes the start positions of the respective blocks, to the top of the compressed stream 2 as shown in FIG. 2D (step S5).

According to the present embodiment, the results of compression of prior blocks are included in the dictionary when compressing the blocks subsequent to the initial block. This can prevent the dictionary from being limited in size. It is therefore possible to avoid a drop in the compression rate of the input stream.

In the compressed stream 2, the dictionary to be retrospectively referred from the codes of a block consists of the results of compression of the prior blocks. Specifically, in the compressed stream 2 of FIG. 2B, the reference code "6, 4" of the "block 1" corresponds to the case of referring to the result of compression of the prior "block 0." Since the dictionary to be referred to consists of the results of compression, the blocks prior to a block to be decoded need not have been decoded in advance even when the block to be decoded is an intermediate block of the compressed stream 2. According to the present embodiment, there is thus the merit of high speed decoding.

The present invention is not limited to the foregoing embodiment. The embodiment of the present invention may be practiced with various modifications within the scope of the claims of this application. For example, the input stream (1) is not limited to a character string as described above, but may be image data.

FIG. 3 shows an example where the present invention is applied to the processing for compressing icon image data. In this example, the input stream 1 to be compressed contains the icon images of antenna sensitivity marks which are used in cellular phones etc. Icon image data is typically small in size, and is often used in a large volume at a time. In the decoding process of the compressed icon images, it is desirable that images can be decoded at random. Even in such applications, the input stream 1 can be divided into blocks, for example, each of which has a predetermined number of icon images as a block unit, and compressed by the same procedure as in the foregoing embodiment. This makes it possible to achieve a higher compression ratio and perform the random decoding processing of the icon images at high speed.

Moreover, even if the input stream contains icon image data and character strings in combination, such as with e-mail, the input stream can be compressed by the same procedure as in the foregoing embodiment.

The present invention may be practiced as a program corresponding to the operation of the computer in the foregoing embodiment, or a recording medium containing the program.

The invention claimed is:

1. A data compression method comprising:
    dividing a data stream of a code string into blocks;
    compressing a first block of the blocks by a sliding dictionary method with codes of the first block as a reference dictionary;
    recognizing blocks subsequent to the first block in succession as a target block to be compressed; and
    compressing the target block by the sliding dictionary method with codes of the target block and results of compression of blocks prior to the target block as a reference dictionary each time the target block is recognized, and arranging a result of compression of the target block at an end of the results of compression of the prior blocks.

2. The data compression method according to claim 1, comprising:
    recording position information indicating start positions of the respective results of compression as to the blocks; and
    adding the position information to the top of a series of the results of compression as to the blocks.

3. The data compression method according to claim 1, wherein the data stream includes icon image data.

4. A data compression apparatus comprising:
    a unit for dividing a data stream of a code string into blocks;
    a unit for compressing a first block of the blocks by a sliding dictionary method with codes of the first block as a reference dictionary;
    a unit for recognizing blocks subsequent to the first block in succession as a target block to be compressed; and
    a unit for compressing, each time the target block is recognized, the target block by the sliding dictionary method with codes of the target block and results of compression of blocks prior to the target block as a reference dictionary, and arranging a result of compression of the target block at an end of the results of compression of the prior blocks.

5. The data compression apparatus according to claim 4, comprising:
    means for recording position information indicating start positions of the respective results of compression as to the blocks; and
    means for adding the position information to the top of a series of the results of compression as to the blocks.

6. The data compression apparatus according to claim 4, wherein the data stream includes icon image data.

7. A computer readable recording medium with a program for causing a computer to perform the steps of:
    dividing a data stream of a code string into blocks;
    compressing a first block of the blocks by a sliding dictionary method with codes of the first block as a reference dictionary;
    recognizing blocks subsequent to the first block in succession as a target block to be compressed; and
    compressing the target block by the sliding dictionary method with codes of the target block and results of compression of blocks prior to the target block as a reference dictionary each time the target block is recognized, and arranging a result of compression of the target block at an end of the results of compression of the prior blocks.

8. The computer readable recording medium according to claim 7, causing the computer to perform the steps of:
recording position information indicating start positions of the respective results of compression as to the blocks; and
adding the position information to the top of a series of the results of compression as to the blocks.

9. The computer readable recording medium according to claim 7, wherein the data stream includes icon image data.

* * * * *